United States Patent
Kato et al.

(10) Patent No.: US 7,482,618 B2
(45) Date of Patent: Jan. 27, 2009

(54) ZNO GROUP EPITAXIAL SEMICONDUCTOR DEVICE AND ITS MANUFACTURE

(75) Inventors: Hiroyuki Kato, Tokyo (JP); Kazuhiro Miyamoto, Tokyo (JP); Michihiro Sano, Tokyo (JP); Takafumi Yao, Sendai (JP)

(73) Assignees: Stanley Electric Co., Ltd., Tokyo (JP); Tafafumi Yao, Sendai-shi (JP)

( * ) Notice: Subject to any disclaimer, the term of this patent is extended or adjusted under 35 U.S.C. 154(b) by 0 days.

(21) Appl. No.: 11/031,572

(22) Filed: Jan. 6, 2005

(65) Prior Publication Data

US 2005/0145840 A1 Jul. 7, 2005

(30) Foreign Application Priority Data

Jan. 6, 2004 (JP) ............................. 2004-001240

(51) Int. Cl.
*H01L 33/00* (2006.01)
(52) U.S. Cl. .................... 257/13; 257/E33.019; 438/46
(58) Field of Classification Search .................... 257/13, 257/E33.019; 438/46, 47
See application file for complete search history.

(56) References Cited

U.S. PATENT DOCUMENTS

| | | | |
|---|---|---|---|
| 6,617,183 B2* | 9/2003 | Kadota et al. .................. 438/22 |
| 6,664,565 B1 | 12/2003 | Sano et al. | |
| 6,673,478 B2 | 1/2004 | Kato et al. | |
| 2006/0252164 A1* | 11/2006 | Yao et al. ....................... 438/22 |
| 2007/0134842 A1* | 6/2007 | Kotani et al. ................. 438/104 |

FOREIGN PATENT DOCUMENTS

| | | |
|---|---|---|
| JP | 2001-68485 A | 3/2001 |
| JP | 3424814 B2 | 5/2003 |
| JP | 2003-282602 A | 10/2003 |

OTHER PUBLICATIONS

Chen et al. Effects of an extremely thin buffer on heteroepitaxy with large lattic mismatch. Applied Physics Letters. vol. 78, No. 21, May 2001.*

Ng et al. Complete Guide to Semiconductor Devices. John Wiley and Sons, Inc. New York. (2002).*

(Continued)

*Primary Examiner*—Lex Malsawma
*Assistant Examiner*—William F Kraig
(74) *Attorney, Agent, or Firm*—Frishauf, Holtz, Goodman & Chick, P.C.

(57) ABSTRACT

A method for manufacturing a semiconductor device includes the steps of: (a) preparing a non-polar single crystal substrate; (b) epitaxially growing an MgO layer on the non-polar single crystal substrate to a thickness of 3 nm or thicker to have rocksalt structure at a substrate temperature of 500° C. to 800° C.; (c) growing on the MgO layer a low temperature growth layer made of ZnO group material at a substrate temperature of 500° C. or lower; (d) annealing the low temperature growth layer above the substrate at a temperature of 700° C. or higher; and (e) epitaxially growing a high temperature growth layer of ZnO group material on the annealed low temperature growth layer at a temperature of 600° C. or higher.

26 Claims, 11 Drawing Sheets

OTHER PUBLICATIONS

Minegishi et al. ("Selective Growth of Zn- and O-polar ZnO Layers by Plasma-Assisted Molecular Beam Epitaxy", J. Vac. Sci. Technol. B 23(3), May/Jun. 2005).*

Setiawan et al. Thin Solid Films. vol. 445, Issue 2. Dec. 15, 2003. pp. 213-218.*

Suzuki et al., "Surfactant-Mediated Molecular Beam Epitaxy of ZnO", J. Korean Phys. Soc., vol. 49, No. 3, Sep. 2006, pp. 1266-1270.*

Tsukazaki et al., "Repeated temperature modulation epitaxy for p-type doping and light-emitting diode based on ZnO", Nature Materials, vol. 4, Jan. 2005, Published Online Dec. 19, 2004.*

Özgür et al., "A comprehensive review of ZnO materials and devices", J. Appl. Phys. 98, 041301 (2005).*

Hwang et al., "ZnO thin films and light-emitting diodes", J. Phys. D: Appl. Phys. 40 (2007) R387-R412.*

Shtereva et al., "P-Type Conduction in Sputtered ZnO Thin Films Doped by Nitrogen", Proc. 25th International Conference on Microelectronics (MIEL 2006), Belgrade, Serbia and Montenegro, May 14-17, 2006.*

Huang et al., "Growth of N-doped p-type ZnO films using ammonia as dopant source gas", Journal of Materials Science Letters 22, 2003, 249-251.*

D.M. Bagnall et al, "Optically pumped lasing of ZnO at room temperature", *Appl. Phys. Lett.*, 70 (17), pp. 2230-2232 (Apr. 28, 1997).

Y. Chen et al, "Layer-by-layer growth of ZnO epilayer on $Al_2O_3$ (0001) by using a MgO buffer layer", *Appl. Phys. Lett.*, vol. 76, No. 5, pp. 559-561 (Jan. 31, 2000).

K. Miyamoto et al, "Effects of ZnO/MgO Double Buffer Layers on Structural Quality and Electron Mobility of ZnO Epitaxial Films Grown on *c*-Plane Sapphire", *Jpn. J. Appl. Phys.*, vol. 4, pp. L1203-L1205 (2002).

Yefan Chen et al., "Morphology evolution of ZnO (000 1) surface during plasma-assisted molecular-beam epitaxy," *Applied Physics Letters*, vol. 80, No. 8, Feb. 25, 2002, pp. 1358-1360.

Hiroyuki Kato et al., "Polarity control of ZnO on sapphire by varying the MgO buffer layer thickness," *Applied Physics Letters*, vol. 84, No. 22, May 31, 2004, pp. 4562-4564.

Yefan Chen et al., "Two-dimensional growth of ZnO films on sapphires (000 1) with buffer layers," *Journal of Crystal Growth*, 214/215, 92000), pp. 87-91.

Yefan Chen et al., "Layer-by-layer growth of ZnO epilayer on $Al_2O_3$ (0001) by using a MgO buffer layer," *Applied Physics Letters*, vol. 76, No. 5, Jan. 31, 2000, pp. 559-561.

* cited by examiner

Zn-POLARITY

○ O
⊙ Zn

O-POLARITY

○ O
⊙ Zn 0.87 nm 1.03 nm 6.2 nm 15.5 nm

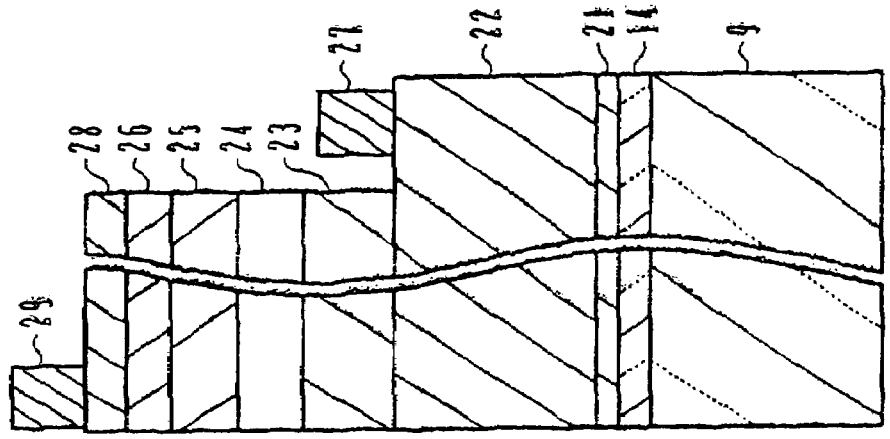
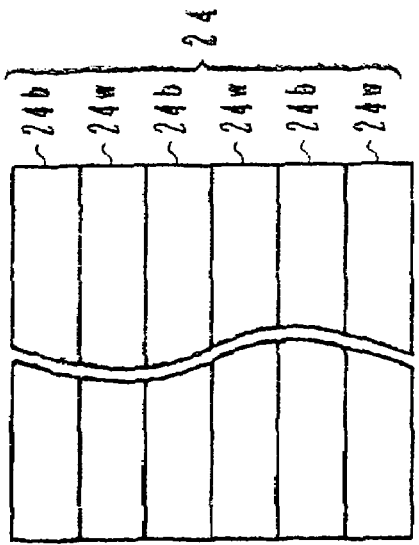
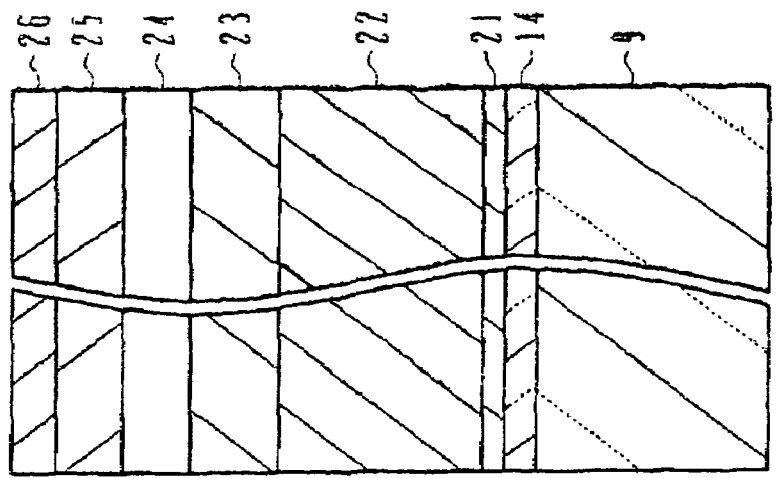

US 7,482,618 B2

ZNO GROUP EPITAXIAL SEMICONDUCTOR DEVICE AND ITS MANUFACTURE

CROSS REFERENCE TO RELATED APPLICATION

This application is based on and claims priority of Japanese Patent Application No. 2004-001240 filed on Jan. 6, 2004, the entire contents of which are incorporated herein by reference.

BACKGROUND OF THE INVENTION

A) Field of the Invention

The present invention relates to a semiconductor device having a ZnO layer or a ZnO group material layer and its manufacture. The ZnO group material is a material which contains one or more elements selected from a group consisting of (Zn, Mg, Cd and Be) and one or more elements selected from a group consisting of (O, S, Se, and Te) and has the same crystal structure as that of ZnO.

B) Description of the Related Art

Zinc oxide (ZnO) is an attractive material for high-efficiency, ultraviolet laser diodes (LD), and light-emitting diodes (LED), because it has a direct transition type energy gap of 3.37 eV at room temperature with a large excitonic binding energy of 60 meV. Optically pumped, excitonic lasing at room temperature from ZnO has been reported in Appl. Phys. Lett. 70 (1977) 2230.

Conventionally, ZnO crystals are epitaxially grown on a sapphire substrate by, for example, molecular beam epitaxy (MBE). There is a large in-plane lattice mismatch of about 18% between ZnO and sapphire. It is therefore difficult to form an epitaxial layer having a good crystalline quality.

Japanese Patent laid-open Publication No. 2001-68485 (which is now Japanese Patent No. 3424814 and corresponds to U.S. Pat. No. 6,664,565 which is incorporated herein by reference) proposed a crystal growth method by which a ZnO layer is first grown on a sapphire substrate at lower temperature than the so-called epitaxial growth temperature, this ZnO layer grown at low temperature is annealed at a higher temperature around the epitaxial growth temperature, enabling recrystalization, and thereafter, a ZnO layer is epitaxially grown at the high epitaxial growth temperature. With this method, the crystal quality of a ZnO layer can be improved much more than when a ZnO layer is epitaxially grown at a high temperature directly on a sapphire substrate.

Since there is a large in-plane lattice mismatch of about 18% between a c-plane sapphire substrate and ZnO to be formed thereon, two configurations of ZnO are possible on a c-plane of sapphire: one in which [11-20] axes of sapphire and ZnO are aligned; and another in which [1-100] axis of ZnO is aligned with [11-20] axis of sapphire. These two configurations are 30 degrees rotated on the c-plane of sapphire. Appl. Phys. Lett. 76 (2000) 559 and Jpn. J. Appl. Phys. 41 (2002) L1203 proposed to introduce an MgO buffer layer at the interface between a sapphire substrate and a ZnO layer in order to eliminate the coexistence of 30°-rotated two configurations.

Japanese Patent Laid-open Publication No. 2003-282602 (which corresponds to U.S. Pat. No. 6,673,478 which is incorporated herein by reference) proposed to incline the surface of the uppermost underlying body, on which crystal growth is carried out, from the c-plane, to expose steps at an atomic level and grow a ZnO epitaxial layer having a good crystal quality.

The c-planes perpendicular to the c-axis of ZnO include two polar planes, a Zn plane (+c) and an O plane (−c). When a ZnO group compound semiconductor thin film is grown on a sapphire substrate having (11-20) plane (a-plane) or (0001) plane (c-plane), this thin film is generally grown in a −c polarity (−c oriented direction, O plane). The O plane has poor crystalline characteristics with respect to the characteristics of semiconductor devices.

For example, in order to form a p-type crystal, nitrogen (n) is required to be doped at least $10^{19}$ cm$^{-3}$ to obtain good properties of devices, when an activation probability is considered. It is possible to dope nitrogen at $10^{19}$ cm$^{-3}$ or higher into −c plane ZnO by setting a low growth temperature under Zn-rich conditions. However, this low growth temperature is likely to deteriorate crystallinity and increase dislocation densities, non-radiative centers, and residual carrier concentration caused by defects. The possibility of obtaining only a film insufficient for light emission devices is not negligible.

By using a ZnO substrate with a Zn plane or a substrate having a GaN layer exposing a Ga plane as a template, a ZnO layer having a +c polarity (Zn plane) can be grown. However, these substrates are expensive.

SUMMARY OF THE INVENTION

An object of this invention is to provide a semiconductor device having a ZnO layer suitable for a light emission device.

Another object of the present invention is to provide a semiconductor device comprising a ZnO layer or a mixed crystal layer of (Zn, Mg, Cd, Be) and (O, S, Se and Te), having a Zn (or equivalent group II atom) plane or a +c polar plane.

Still another object of the present invention is to provide a manufacture method for a semiconductor device comprising a ZnO layer or a mixed crystal layer of (Zn, Mg, Cd, Be) and (O, S, Se and Te), having a Zn (or equivalent group II atom) plane or a +c polar plane.

According to one aspect of the present invention, there is provided a semiconductor device comprising: an underlying layer having a single crystal surface; an MgO epitaxial layer grown above the underlying layer, which enables, when a ZnO layer is grown thereon, to provide a +c polarity; and an epitaxial layer grown on the MgO epitaxial layer, having the +c polarity and made of ZnO or a mixed crystal of (Zn, Mg, Cd, Be) and (O, S, Se, Te).

According to another aspect of the present invention, there is provided a manufacture method for a semiconductor device comprising the steps of: (a) preparing an underlying layer having a single crystal surface; (b) epitaxially growing an MgO layer above the underlying layer to a thickness which enables, when a ZnO layer is grown thereon, to provide a +c polarity; and (c) growing on the MgO layer a layer made of ZnO or a mixed crystal of (Zn, Mg, Cd, Be) and (O, S, Se, Te).

A ZnO layer or a mixed crystal layer of (Zn, Mg, Cd, Be) and (O, S, Se, Te) can be formed which has the Zn plane or +c plane. By controlling the thickness of an MgO layer, a −c plane ZnO group material layer and a +c plane ZnO material layer can be selectively grown.

BRIEF DESCRIPTION OF THE DRAWINGS

FIGS. 9A to 9D are cross sectional views of a substrate illustrating manufacture processes for a semiconductor device.

DESCRIPTION OF THE PREFERRED EMBODIMENTS

The present inventors have studied a method of forming ZnO crystals having a good crystalline quality by growing an MgO layer on a sapphire substrate by MBE and growing a ZnO layer thereon. This method will be described along with experiments made by the present inventors.

Figure 1A:
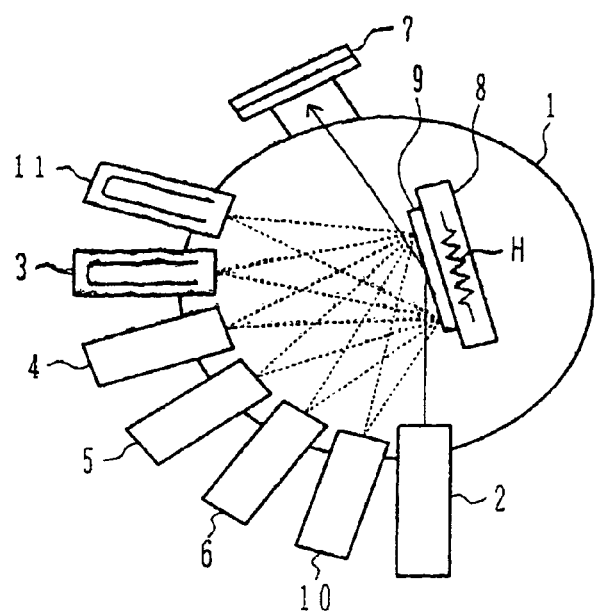
FIGS. 1A to 1E are a schematic cross sectional view showing the structure of a molecular beam epitaxy system and cross sectional views of a substrate, respectively for explaining experiments made by the present inventors.

FIG. 1A is a schematic diagram showing an MBE crystal growth system used for growing ZnO crystals. A stage 8 with a heater H is installed in a ultra high vacuum chamber 1. A sapphire substrate 9 is placed on the stage 8. The ultra high vacuum chamber 1 is provided with: a zinc source gun 3 for injecting (or ejecting) a zinc beam from a K cell; a hydrogen source gun 4 for injecting hydrogen beam thermally cracked by the heat of a tungsten filament; an oxygen source gun 5 for injecting an oxygen radical beam obtained by radicalizing oxygen gas; a nitrogen source gun 6 for injecting a nitrogen radical beam obtained by radicalizing nitrogen gas; and a magnesium source gun 11 for injecting a magnesium beam from a K cell. The hydrogen source gun is used for cleaning the substrate, and the nitrogen source gun is used for doping N as the impurities to be used when a p-type layer is formed. Another source gun 10 is also mounted for n-type impurities. Beams from the source guns and cracked hydrogen can be supplied to the sapphire substrate 9 at the same time.

The ultra high vacuum chamber 1 is also provided with a reflection high-energy electron diffraction (RHEED) gun 2 and an RHEED screen 7. Electrons emitted from the RHEED gun 2 are diffracted in crystals formed on the sapphire substrate 9, and become incident upon the RHEED screen 7. Crystals formed on the sapphire substrate 9 can therefore be observed.

As the source gas of the nitrogen radical beam to be injected from the nitrogen source gun 6, for example, nitrogen dioxide ($NO_2$), oxygen dinitride ($N_2O$) or the like may be used. Cracked ammonium ($NH_3$) may also be injected from the nitrogen source gas 6.

Figure 1B:
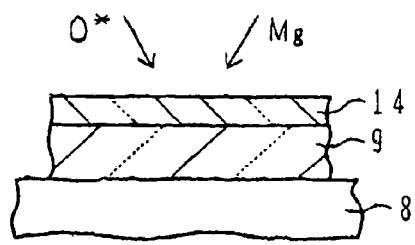

As shown in FIG. 1B, the c-plane sapphire substrate 9 degreased by organic solvent is mounted on the substrate stage 8 of the MBE system, and the inside of the ultra high vacuum chamber 1 is evacuated toga high vacuum at a pressure of $1 \times 10^{-7}$ Pa or lower. Hydrogen gas is cracked, and while atomic hydrogen is irradiated to the sapphire substrate 9, heat treatment is performed at 800° C. for 30 minutes to clean the substrate surface.

After the surface cleaning, the substrate temperature is set to 500° C. to 800° C. and a magnesium beam from the magnesium source gun 11 and an oxygen radical beam from the oxygen source gun 5 are irradiated to the substrate 9 to grow an MgO layer 14. There is a lattice mismatch of 8.4% between MgO and sapphire. Samples were formed having a MgO layer with respective thicknesses of 0 nm, about 1.0 nm, about 2.1 nm, about 3.1 nm, about 4.1 nm and about 6.2 nm. The film thickness was calculated from an average growth rate and a growth time.

Figure 1C:
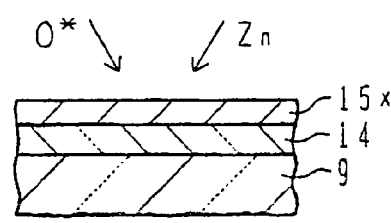

As shown in FIG. 1C, after the substrate temperature was lowered to 500° C. or lower, e.g., 400° C., a Zn beam from the Zn source gun 3 and an O radical beam from the oxygen source gun 5 were irradiated on the surface of the MgO layer 14 to grow a low temperature growth ZnO buffer layer 15x.

Figure 1D:
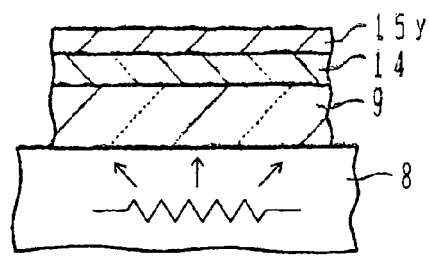

As shown in FIG. 1D, the substrate formed with the low temperature growth ZnO layer 15x is heated to 700° C. or higher, e.g., 800° C. to perform heat treatment (annealing or recrystalization) for several minutes. Migration and the like occur in the low temperature growth ZnO layer 15x so that the crystallinity is improved and a ZnO layer 15y having a planarized surface is formed.

Figure 1E:
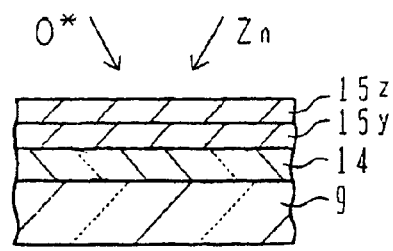

As shown in FIG. 1E, the substrate temperature is set to a temperature of 600° C. or higher suitable for ZnO epitaxial growth, e.g., 650° C. A Zn beam from the Zn source gun 3 and an O radical beam from the oxygen source gun 5 are again irradiated on the annealed ZnO layer 15y to grow a ZnO layer 15z.

The rates of growing ZnO layers 15z were measured by growing MgO layers of the above-described six thicknesses in the process shown in FIG. 1B, and growing the respective ZnO layers thereon under the uniformalized constant flux conditions in the process shown in FIG. 1E.

Figure 2A:
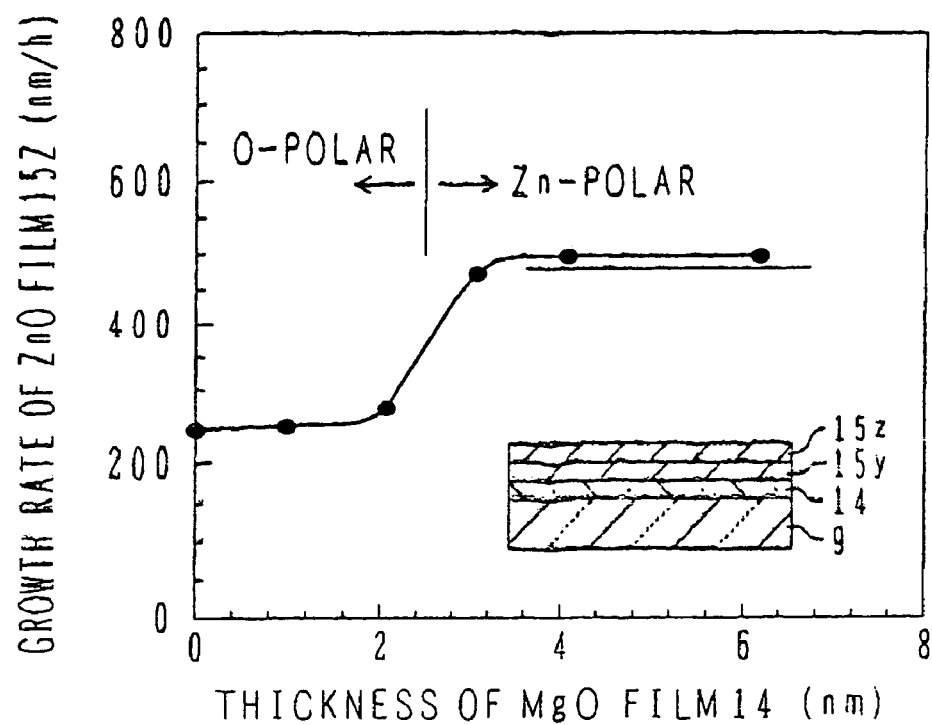
FIGS. 2A to 2C are a graph showing a change in a ZnO film growth rate relative to a thickness of an underlying MgO film, and schematic perspective views showing Zn-polarity and O-polarity of ZnO.

FIG. 2A is a graph plotting the growth rates of the ZnO films 15zformed in the process of FIG. 1E, with respect to the thickness of the MgO film 14. In the region of the thickness of the MgO film 14 from 0 to about 1.0 nm, the growth rate of the ZnO film 15z is at about 250 nm/h, and is generally constant. In contrast, in the region of the thickness of the MgO film 14 about 4.1 nm or thicker, the growth rate of the ZnO film 15z is increased about twice to about 500 nm/h, and also is generally constant. At the thickness of the MgO film at about 3.1 nm, the growth rate is lowered slightly relative to 4.1 nm or higher, and is near 500 nm/h. A change in growth mechanism is suggested by a change of about a twofold in the growth rate of the ZnO film 15z at the MgO film thickness of about 3 nm or thicker, compared to about 1.0 nm or thinner.

The growth rate of the ZnO film 15z at the thickness of the MgO film 14 of about 2.1 nm has an in-plane distribution, and is about 350 nm/h in the central area. This rate is apparently faster than the growth rate of about 250 nm/h at the MgO film thickness of about 1.0 nm or thinner, indicating a start of the change in growth mechanism. In the following, studies will be given on the +c and −c growths. Since ZnO growth is executed in the O-rich conditions, the terminating front end surface is considered to be O plane.

Figure 2B:
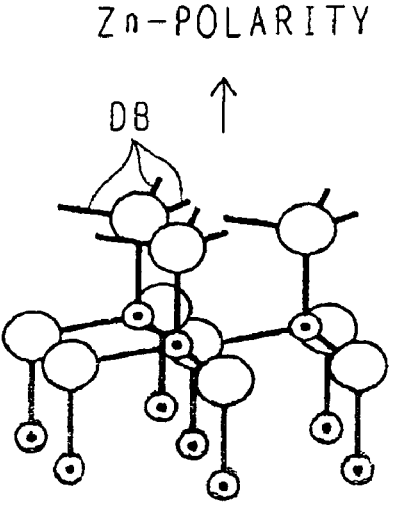

FIG. 2B shows a Zn-polarity (+c) plane of ZnO crystal. Three dangling bonds DB extend upward from each oxygen atom O. When crystals are cleaved at the c-plane, the cleavage plane is at a location where an upper oxygen atom and a lower Zn atom is bonded by a single bond. The uppermost surface is therefore the Zn plane. When O atoms are bonded to the Zn atoms, each O atom extends three dangling bonds upward.

Figure 2C:
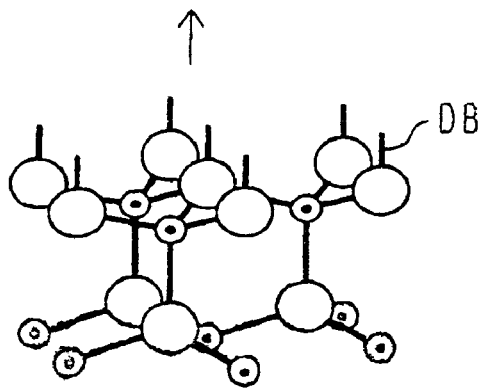

FIG. 2C shows an O polar (−c) plane of ZnO crystal. One dangling bond extends upward from each oxygen atom. The cleavage plane of the c-plane is at a location where the upper Zn atom and the lower O atom is bonded by a single bond, and is the O plane. Each O atom extends or stretches one dangling bond upward.

It can be considered that the growth rate increases because the Zn bonding coefficient is larger on the Zn-polarity plane than on the O-polarity plane due to a difference of the dangling bond configuration on the O uppermost plane. A change in the growth rate shown in FIG. 2A may be ascribed to a change in the polar plane.

In order to correctly judge the polarity of the formed ZnO film, evaluation was performed through convergent beam electron diffraction (CBED).

Figure 3A:
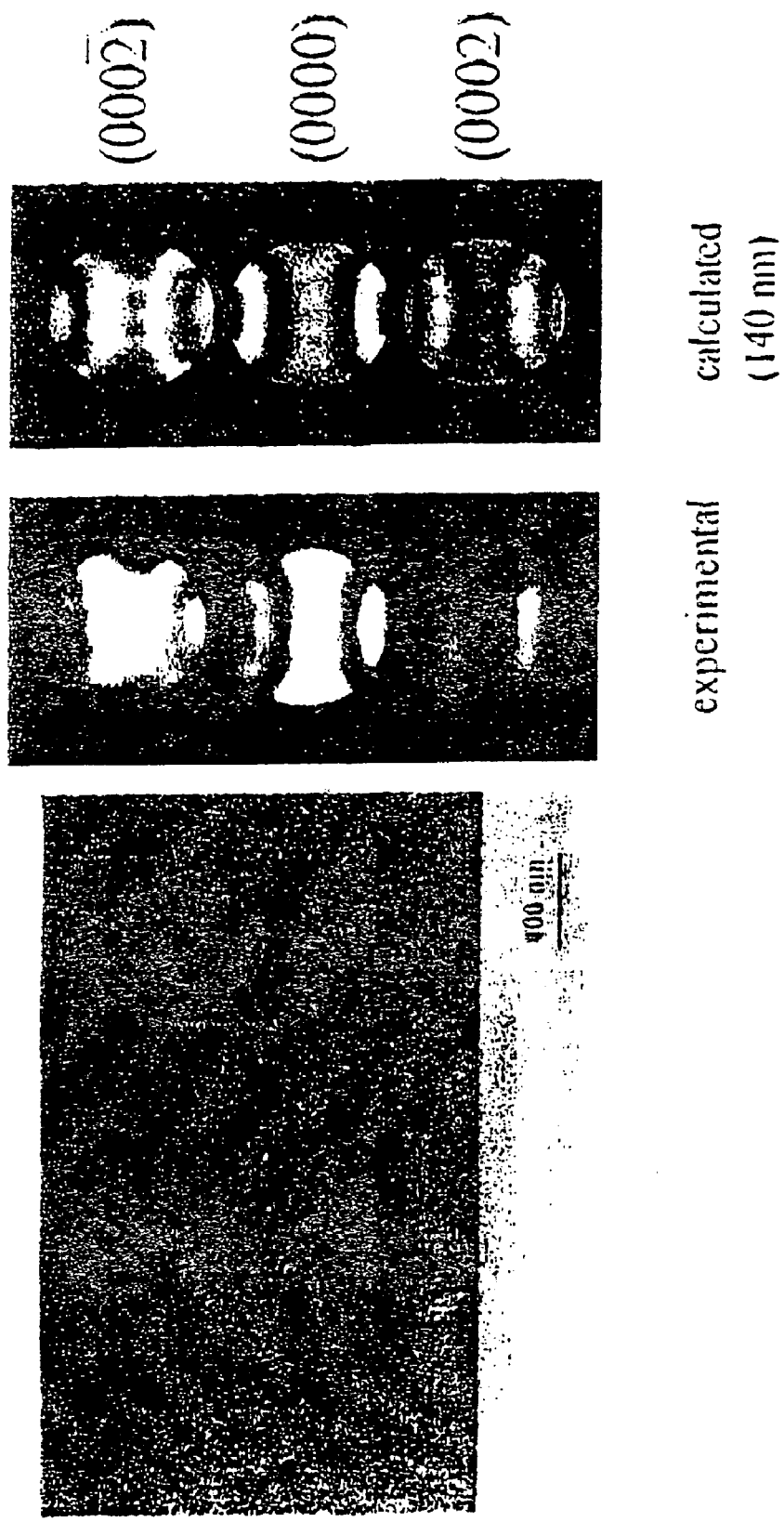
FIGS. 3A and 3B are a TEM photograph and a CBED pattern photograph of two samples.
Figure 3B:
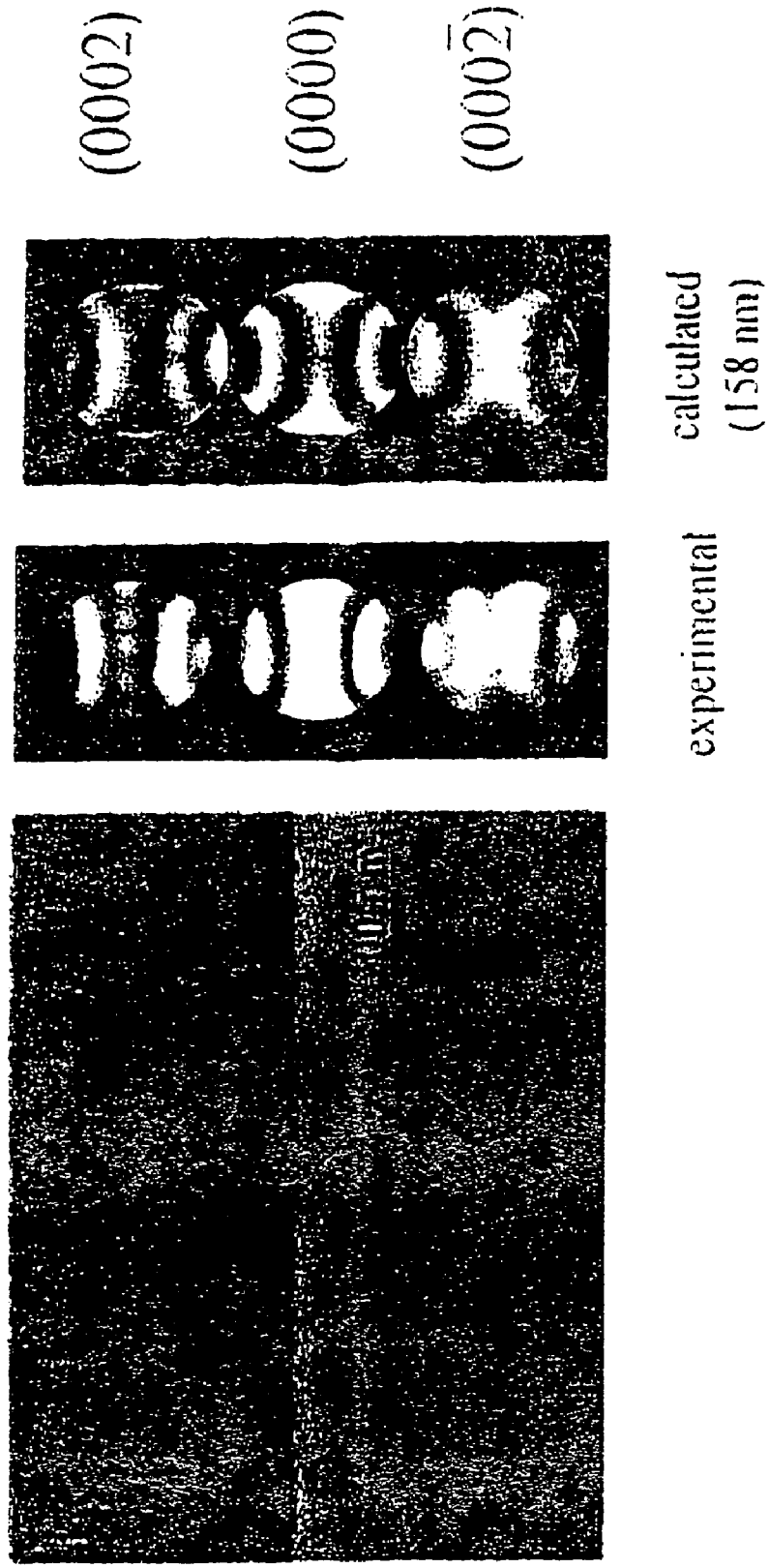

FIGS. 3A and 3B are a transmission electron microscopy (TEM) photograph showing a cross sectional view and a CBED pattern (actual measurement and calculation) photograph of two ZnO film samples: a sample grown on the MgO film 14 having a thickness of 1 nm formed on a c-plane sapphire substrate and a sample grown on the MgO film 14 having a thickness of 6 nm. A large left photograph is a TEM photograph, an upper portion shows a ZnO film and a lower portion shows a sapphire substrate. The middle and right photographs show CBED patterns. The middle pattern was calculated and the right pattern was measured. For the calculation simulation, the thicknesses of the sample films are assumed to be 140 nm and 158 nm. Actual measurement and calculation indicate fair coincidence.

In FIGS. 3A and 3B, the middle portion of the CBED pattern is the (0000) plane, the upper portion is the (000-2) plane (FIG. 3A) and the (0002) plane (FIG. 3B), and the lower portion is the (0002) plane (FIG. 3A) and the (000-2) plane (FIG. 3B). The inverted black and white patterns are shown.

It can be seen that the ZnO film grown on the MgO film having a thickness of 1 nm has the O-polarity (−c) (growth direction is [000-2]) and the ZnO film grown on the MgO film having a thickness of 6 nm has the Zn-polarity (+c) (growth direction is [0002]). When a ZnO film was formed on a MgO film having a thickness of 2.1 nm, both +c and −c are mixed in plane and the growth rate was 350 nm/h, an intermediate rate between −c and +c. The peripheral area was a −c growth region.

These results elucidate that a ZnO film of the Zn-polarity (+c) and a ZnO film of the O-polarity (−c) can be selectively grown on the MgO film by adjusting the thickness of the MgO film to be formed on the sapphire substrate.

Figure 4A:
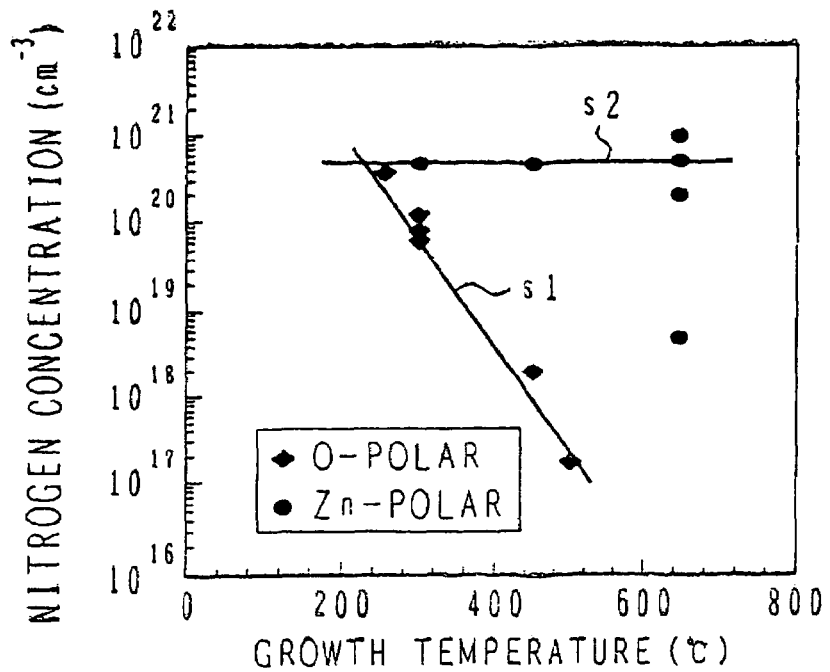
FIGS. 4A and 4B are a graph showing a change in a nitrogen concentration relative to a growth temperature of a Zn-polarity sample and an O-polarity sample, and a graph showing changes in X-ray diffraction peak widths (FWHM) relative to a growth temperature.

FIG. 4A is a graph showing a growth temperature dependency of a nitrogen concentration in a ZnO film doped with nitrogen (N). The conditions of supplying nitrogen for samples other than those at 650° C., were set under the constant conditions. A nitrogen concentration was calculated through secondary ion mass spectroscopy (SIMS).

At a growth temperature of 650° C. or higher, in samples s1 of the O-polarity, nitrogen cannot be doped more than $1 \times 10^{17}$ cm$^{-3}$ which is a lower detection limit of SIMS. As the growth temperature is lowered, nitrogen concentration in the film increases. At a growth temperature of 300° C., N can be doped about $10^{20}$ cm$^{-3}$. For example, if nitrogen is to be doped at $10^{19}$ cm$^{-3}$, it is necessary to set the growth temperature to about 400° C. or lower.

In samples s2 of the Zn-polarity, nitrogen can be doped at $10^{20}$ cm$^{-3}$ or higher regardless of the growth temperature. It has been found that the nitrogen concentration can be controlled in the range from $5 \times 10^{18}$ cm$^{-3}$ to $1 \times 10^{21}$ cm$^{-3}$ by adjusting the growth conditions (O/Zn flux rate, amount of introduced N atoms, etc.) at a growth temperature of 650° C.

As the growth temperature is lowered, a fairly large number of N atoms can be doped also in the ZnO layer of the O-polarity. However, as the growth temperature of the ZnO layer is lowered, the crystallinity of grown crystals is adversely affected.

Figure 4B:
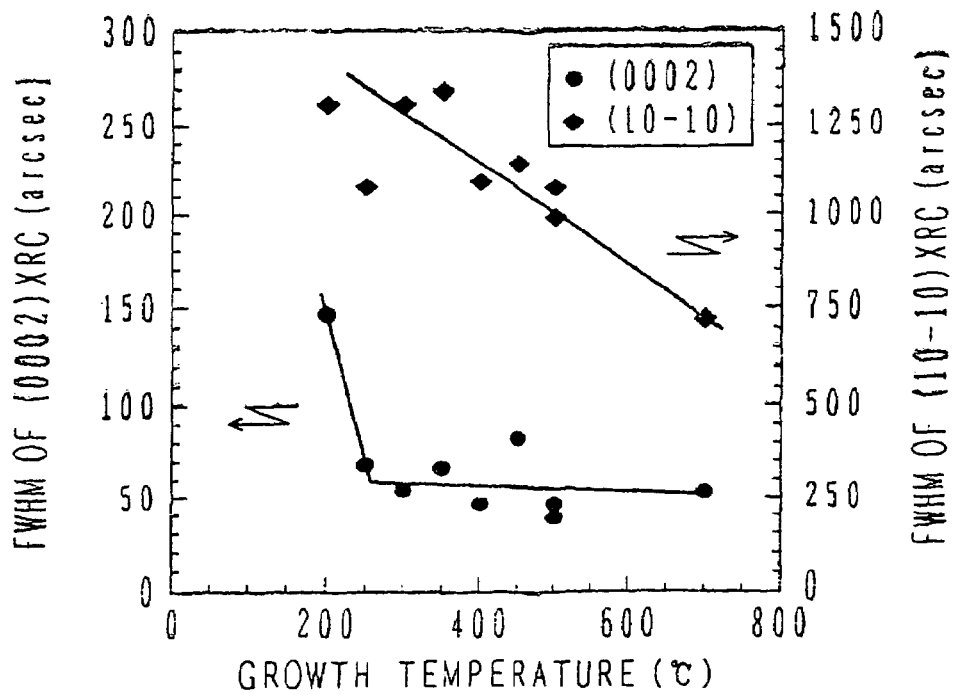

FIG. 4B is a graph showing a relation between a full width at half maximum (FWHM) of an X-ray diffraction peak and a growth temperature. FWHM of a (0002) plane takes generally a constant narrow value at about 250° C. or higher, whereas FWHM of a (10-10) plane takes a value as ten times or more broad as that of the (0002) plane at a growth temperature of 700° C., and as the growth temperature lowers, FWHM further increases and exceeds 1000 arcseconds at 400° C. or lower. This indicates that as the growth temperature is lowered, the crystallinity is degraded. When N is doped in the ZnO layer of the O-polarity, the growth temperature should be lowered to obtain a good doping level so that degradation of crystallinity is inevitable.

If the ZnO layer of the Zn-polarity is used, the growth temperature can be maintained high even when N is doped, so that nitrogen can be doped in the ZnO film at a high concentration without sacrificing the crystallinity.

It has been found that as the thickness of an MgO film on a sapphire substrate is increased to a certain level or thicker, the +c-polar plane can be formed when a ZnO layer is formed on the MgO film. According to the above-described experiments, a ZnO layer of the +c-polarity is expected to be grown on the MgO film having a thickness of about 3 nm or thicker.

Further studies were made on phenomena which occur while an MgO film is grown on a sapphire substrate.

FIGS. 5A to 5E show changes in RHEED during the growth of an MgO film on a c-plane sapphire substrate. FIGS. 5F and 5G are cross sectional views schematically showing the crystal growth in the Stranski-Krastanov (SK) mode. FIG. 5F shows the stage that a wetting layer 51 is two-dimensionally grown on an underlying crystal layer 50. Generally, the wetting layer 51 is very flexible and has a topology conformal to the surface of the underlying crystal layer 50. If there is a lattice mismatch with the underlying layer, strain is accumulated as the film becomes thicker. FIG. 5G shows a stage where three-dimensional crystals reflecting the crystallinity of the grown crystal itself start growing in island shapes. A two-dimensionally grown wetting layer 51 and three-dimensionally grown island-like crystals 52 exist in a mixed state.

Figure 5A:
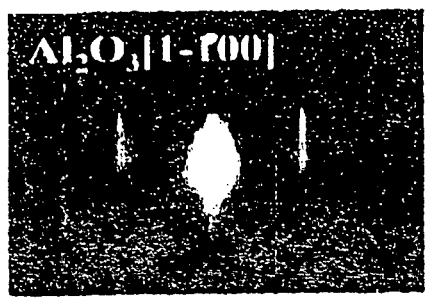
FIGS. 5A to 5G are RHEED pattern photographs and schematic cross sectional views illustrating crystal configurations grown in SK mode.
Figure 5B:
Figure 5C:
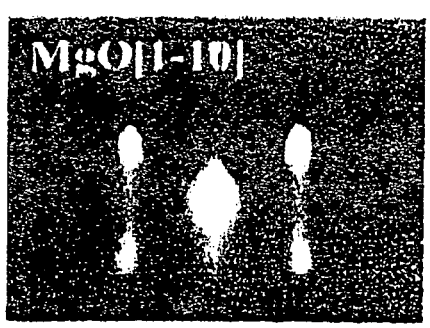

FIG. 5A shows RHEED patterns of a sapphire substrate on which an MgO crystal is to be grown. FIGS. 5B and 5C are RHEED patterns when an MgO film is grown on a sapphire substrate to thicknesses of 0.87 nm and 1.03 nm, respectively. Up to a thickness of 1 nm, striped streak patterns were observed. This may be ascribed to coherent two-dimensional growth. As the film thickness exceeds 1 nm, spots start appearing over the streak pattern. This is considered a change from two-dimensional growth to three-dimensional growth.

Figure 5D:
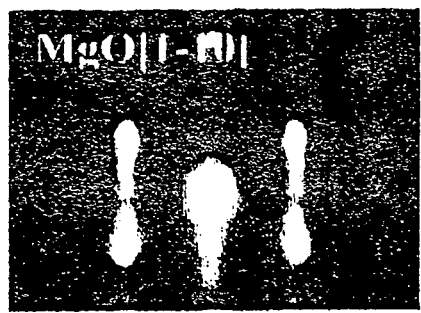
Figure 5E:
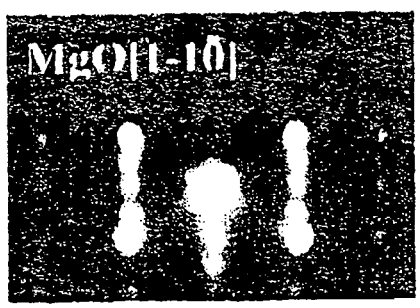
Figure 5F:
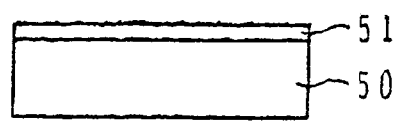
Figure 5G:
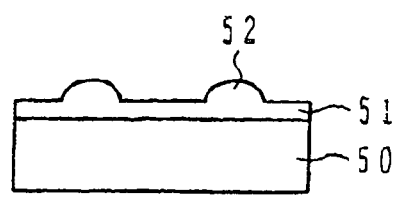

FIGS. 5D and 5E show RHEED patterns at the MgO film thicknesses of 6.2 nm and 15.5 nm. As the film thickness exceeds 6 nm, the patterns change to spot patterns. This may be ascribed to that island-shape three-dimensional growth covers the whole film surface.

It is known that the crystal structure of MgO has generally a rocksalt structure of a cubic crystal system. An Mgo film having a thickness of 62 nm was grown on a sapphire substrate and X-ray diffraction was observed.

Figure 6B:
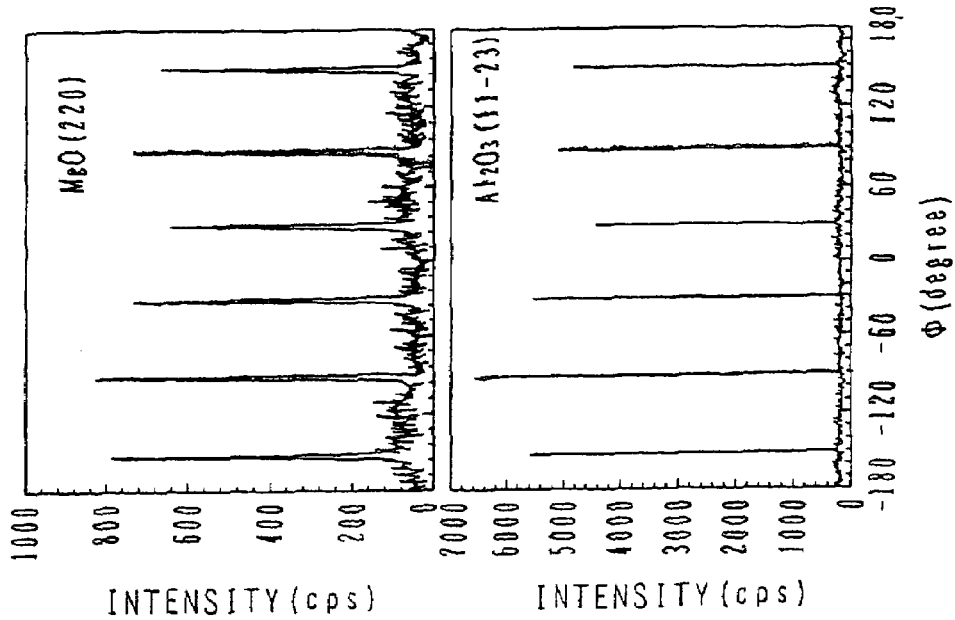
FIGS. 6A and 6B are graphs showing X-ray diffraction results.
Figure 6A:
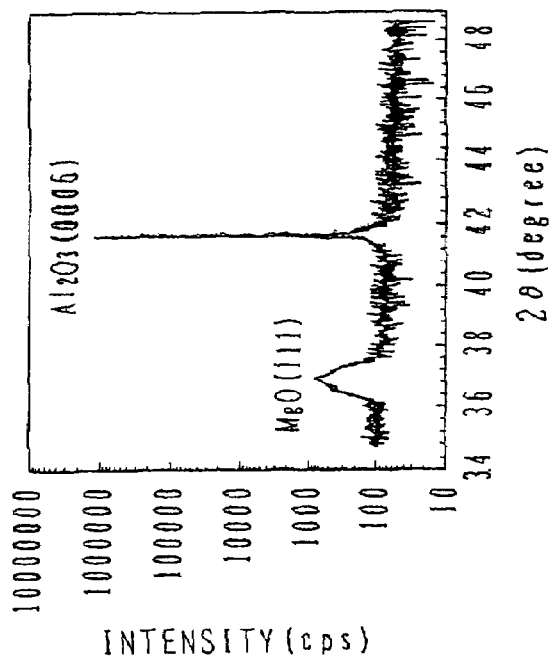

FIG. 6A shows the results of 2θ-θ scan of an MgO film on a sapphire substrate. FIG. 6B shows the results of φ scan of a (220) plane of the MgO film and a (11-23) plane of the sapphire substrate. It was confirmed that the MgO film has the rocksalt structure and has a (111) orientation and that the in-plane orientation relative to sapphire was: MgO (–112) parallel to sapphire (1-100), and MgO (–1-12) parallel to sapphire (11-20).

As a sufficiently thick MgO film of 3 nm or thicker is grown on a sapphire substrate, MgO of the rocksalt structure can be obtained. Then, when ZnO is grown thereon, the Zn (+c) polarity can be obtained. The wetting layer at the stage when an MgO film starts growing is considered to have Wurtzite structure having a topology conformal to the underlying sapphire crystal. It can be considered that as the thickness of the MgO film increases, a change from Wurtzite structure to rocksalt structure occurs.

Figure 7A:
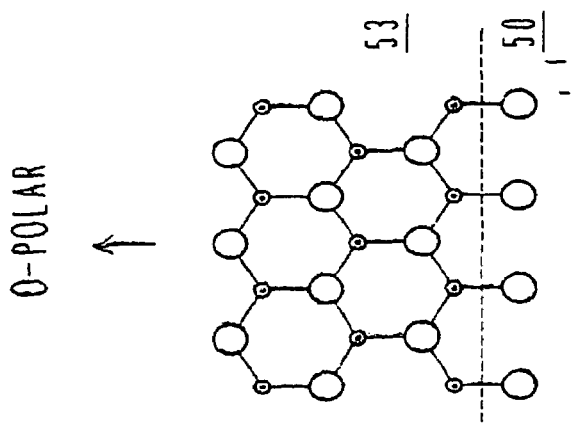
FIGS. 7A, 7B and 7C are schematic sketches showing the ways in which crystals grow.

FIG. 7A shows a case where an MgO film 51 of Wurtzite structure is grown on a sapphire substrate 50 of Wurtzite structure and a ZnO film 53 is grown on the MgO film. The c axis of the Wurtzite structure has two polar planes, and –c (O) polarity MgO is grown on sapphire if the MgO film is 1 nm thick or thinner. Therefore, a ZnO film 53 grown on the MgO film has a –c (O) polarity. This mode corresponds to an MgO film having a thickness of 1 nm or thinner.

Figure 7B:
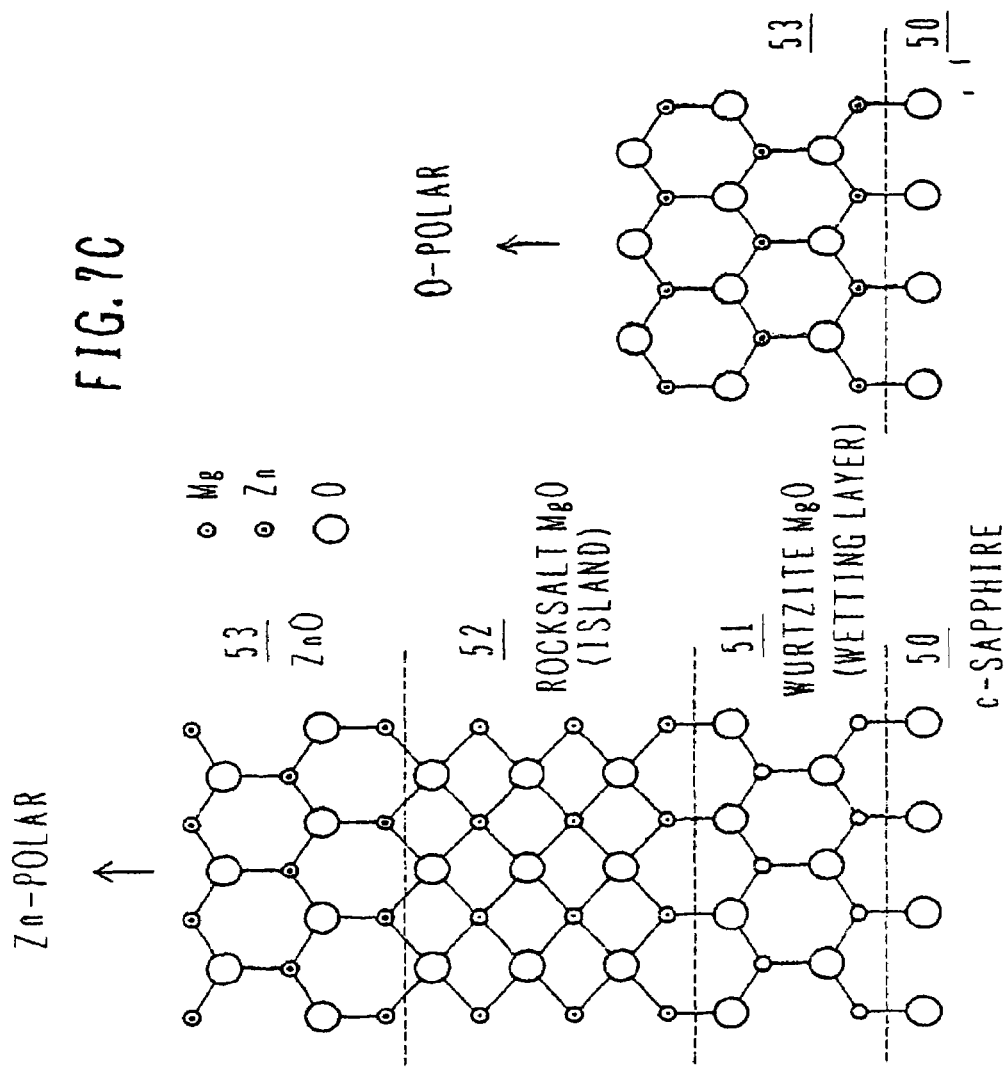

FIG. 7B shows a case where the thickness of a grown MgO film is increased sufficiently. An MgO film 51 of Wurtzite structure is grown on a sapphire substrate 50, then an MgO film 52 of rocksalt structure is grown on the MgO film 51, and a ZnO film 53 is grown on the MgO film 52. The rocksalt structure of the MgO film 52 does not have a polar plane. It can be considered that if MgO is grown under the oxygen-rich conditions, the crystal growth progresses on an oxygen-terminated plane. Each O atom at the uppermost (front end) plane of the rocksalt structure has three dangling bonds, and a Zn atom bonded thereto has one dangling bond in the c axis direction. The ZnO film has therefore a Zn (+c) polarity.

Figure 7C:
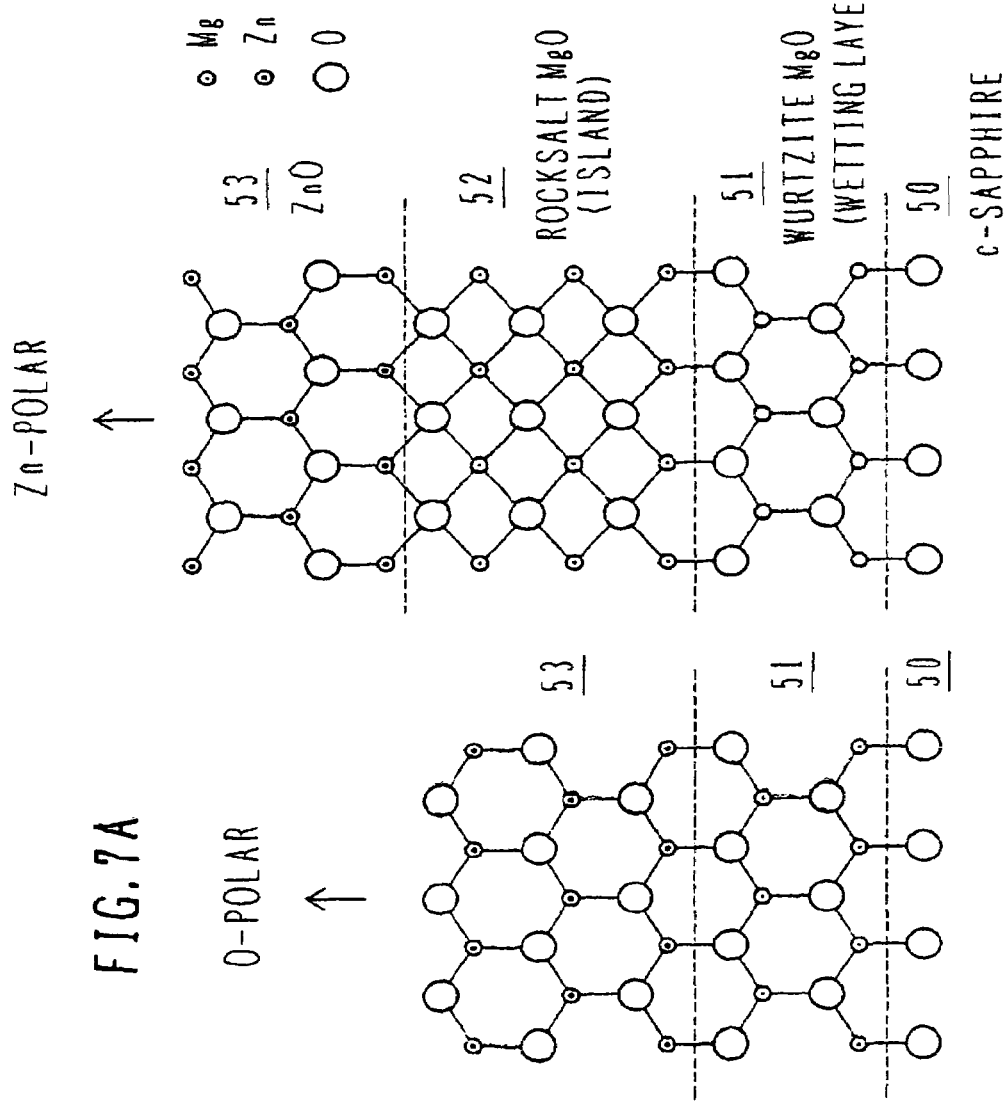

FIG. 7C shows a state where a ZnO film 53 is grown on a sapphire substrate 50, for reference purpose. The ZnO film 53 will have an O (–c) polarity.

Although the above description uses a c-plane sapphire substrate by way of example, similar advantages can be obtained by using other non-polar substrates, such as an a-plane sapphire substrate, an ScAlMgO$_4$ substrate and an Si substrate, when a ZnO film is grown after forming an MgO surface of rocksalt structure. If the amount of lattice mismatch becomes large, a critical thickness becomes thin and it is expected to realize a thinner MgO film having rocksalt structure. If the amount of lattice mismatch becomes small, the critical thickness of an MgO film realizing the rocksalt structure will become thicker. It is preferable to experimentally confirm a desired thickness of an MgO film. Similar results are expected even if a growth temperature is changed if epitaxial growth can be performed.

In the above description, an MgO film is formed on a c-plane sapphire substrate and a ZnO film is formed on the MgO film. Mixed crystals may be formed by replacing the Zn site of ZnO with Mg, Cd, Be or the like and/or replacing the O site with S, Se, Te or the like. It has been empirically confirmed that at least those (Zn, Mg, Cd, Be) (O, S, Se, Te) mixed crystal materials having the same crystal structure as that of ZnO exhibit the properties similar to ZnO. Also in the case when (Zn, Mg, Cd, Be) (O, S, Se, Te) mixed crystal materials having the same crystal structure as that of ZnO is grown on a sapphire substrate, the above-described fenomena are expected by inserting an MgO film therebetween. In the above-described crystal growth, all or a portion of the ZnO film may be a (Zn, Mg, Cd, Be) (O, S, Se, Te) mixed crystal layer. For example, a +c polarity ZnMgO layer is expected to be formed by growing a ZnMgO mixed crystal layer on an MgO film and controlling the thickness of the MgO film. Well and barrier layers can be formed by selecting a band gap by selecting the composition of ZnMgO mixed crystals, while maintaining the +c polarity. Other various device structures can also be realized.

It will also be possible to dope a dopant in a MgO film formed on a sapphire substrate. Material of MgO doped with other elements is also called MgO in this specification. Similar advantages are expected for the case where after a –c polarity ZnO layer is once formed on a sapphire substrate or the like, an MgO him is grown oh the ZnO layer and another ZnO layer is further grown on the MgO film.

Figure 8:
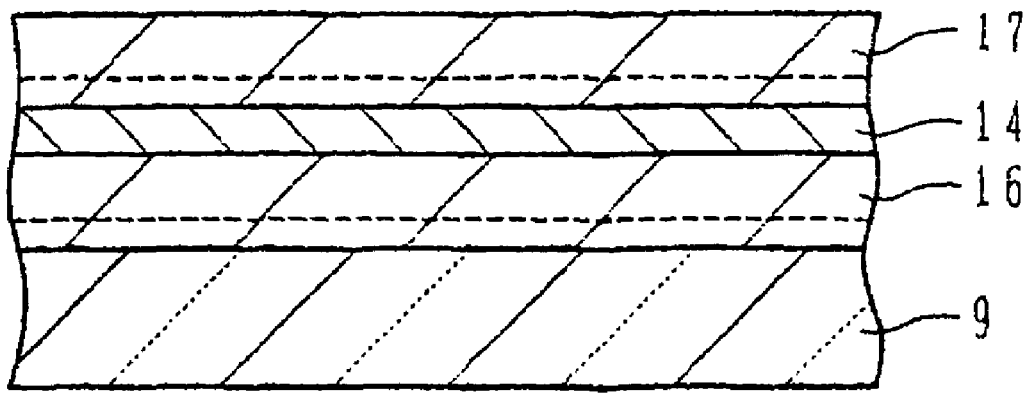
FIG. 8 is a cross sectional view showing another structure of an epitaxial substrate.

As shown in FIG. 8, a –c plane ZnO layer 16 is formed on a sapphire substrate 9 by low temperature growth, annealing and high temperature growth. An MgO layer 14 is grown on the O-polarity (–c) ZnO layer 16 to a thickness of a predetermined value or thicker, and a ZnO layer 17 is grown on the MgO layer 14. In this case, a +c plane ZnO layer 17 is expected to be formed. In this manner, it will be possible to invert the polarity of the ZnO layer from the –c plane to the +c plane.

FIGS. 9A to 9D are schematic cross sectional views illustrating a manufacture method for a ZnO group LED according to an embodiment.

As shown in FIG. 9A, an MgO film 14 is grown on a cleaned sapphire substrate 9 to a thickness of 3 nm or thinner. A ZnO group material layer to be formed on the MgO film can be expected to have the +c plane. On the MgO film 14, a ZnO buffer layer is grown at a low temperature. The ZnO buffer layer 21 is grown at a substrate temperature of 500° C. or lower, e.g., 400 to 500° C. and annealed at 700° C. or higher.

Next, an n-type ZnO layer 22 doped with gallium is formed on the surface of the ZnO buffer layer 21. The n-type ZnO layer 22 has a thickness of 1 to 2 µm and a gallium concentration of $1\times10^{18}$ cm$^{-3}$ or higher. For example, the n-type ZnO layer 22 is grown at a substrate temperature of 600 to 700° C.

Next, on the surface of the n-type ZnO layer 22, an n-type ZnMgO layer 23 is grown at a growth temperature of 350 to 450° C. to a thickness of 300 to 600 nm, the n-type ZnMgO layer being doped with gallium at a concentration of $1\times10^{18}$ cm$^{-3}$.

On the n-type ZnMgO layer 23, ZnO/ZnMgO quantum well layer 24 is formed. Impurities are not doped. The ZnO/ZnMgO quantum well layer 24 will be later described in detail.

On the surface of the ZnO/ZnMgO quantum well layer 24, a p-type ZnMgO layer 25 doped with nitrogen is formed. For example, the p-type ZnMgO layer 25 has a thickness of 100 to 300 nm and a nitrogen concentration of $1\times10^{17}$ cm$^{-3}$ or higher.

Lastly, on the surface of the p-type ZnMgO layer 25, a p-type ZnO layer 26 doped with nitrogen at a concentration of $1\times10^{18}$ cm$^{-3}$ or higher is grown to a thickness of 100 to 200 nm. Both the p-type ZnMgO layer and p-type ZnO layer can be grown at a temperature of 600° C. or higher.

As shown in FIG. 9B, the ZnO/ZnMgO quantum well layer 24 has a lamination structure of a well layer 24w of ZnO and a barrier layer 24b of ZnMgO formed on the surface of the well layer 24w.

As shown in FIG. 9C, the ZnO/ZnMgO quantum well layer 24 may have a multiple quantum well structure having a plurality of the lamination structures of the well layer 24w and barrier layer 24b stacked one on another.

As shown in FIG. 9D, after the above-described layer (film) forming processes, electrodes are formed. The sapphire substrate 9 having the stacked layers from the n-type ZnO buffer layer 21 to p-type ZnO layer 26 is taken out from a ZnO group crystal manufacture system, and a resist film or a protective film or the like is formed to form an etching mask having a cut-off window (n-type electrode forming area) of a predetermined pattern. Thereafter, the area exposed in the cut-off window is etched until the n-type ZnO layer 22 is exposed, for example, by wet etching or reactive ion etching. On the surface of the n-type ZnO layer 22, an n-type electrode 27 is formed. For example, the n-type electrode is made of a lamination of a titanium layer of 2 to 10 nm in thickness and an aluminum layer of 300 to 500 nm in thickness.

Next, the etching mask used for forming the n-type electrode 27 is removed and a p-type transparent electrode 28 is formed on the surface of the p-type ZnO layer 26. For example, the p-type transparent electrode 28 has a lamination structure of a nickel layer having a thickness of 5 to 10 angstroms and a metal layer having a thickness of 100 angstroms formed on the nickel layer.

On the p-type transparent electrode 28, a bonding electrode 29 of gold having a thickness of, e.g., 500 nm is formed. An electrode alloying process is executed thereafter, for example, in an oxygen atmosphere at 700 to 800° C. The alloying process time is 3 to 10 minutes. In the above manner, a ZnO group LED is manufactured.

The present invention has been described along the preferred embodiments. The invention is not limited only to the above embodiments. It will be apparent to those skilled in the art that other various modifications, improvements, combinations, or the like can be made.

What we claim are:

1. A semiconductor device comprising:
    an underlying layer having a single crystal surface;
    an MgO epitaxial layer grown above said underlying layer, which enables, when a ZnO layer is grown thereon, to provide a substantially +c polarity, said MgO epitaxial layer having a thickness of 3.1 nm or thicker, and
    an epitaxial layer grown on said MgO epitaxial layer, and consisting essentially of ZnO having a surface consisting essentially of a +c plane, said epitaxial layer including a p-type sublayer which is doped with N during the epitaxial growth at a concentration of $5\times10^{18}$ cm$^{-3}$ or higher, and said p-type sublayer having an x-ray diffraction peak of a (0002) plane with a full width at half maximum of 40-80 arcsec.

2. The semiconductor device according to claim 1, wherein said MgO epitaxial layer has rocksalt structure.

3. The semiconductor device according to claim 1, wherein said MgO epitaxial layer has a thickness of 4.1 nm or thicker.

4. The semiconductor device according to claim 1, wherein said underlying layer is a non-polar single crystal substrate.

5. The semiconductor device according to claim 4, wherein said non-polar single crystal substrate is a sapphire substrate, an ScAlMgO$_4$ substrate or an Si substrate.

6. The semiconductor device according to claim 4, wherein said non-polar single crystal substrate is a c-plane sapphire substrate.

7. The semiconductor device according to claim 1, wherein said underlying layer is a −c polarity ZnO layer.

8. The semiconductor device according to claim 1, wherein said epitaxial layer further includes an n-type sublayer doped with n-type impurities.

9. The semiconductor device according to claim 1, wherein said epitaxial layer includes a multiple quantum well structure.

10. The semiconductor device according to claim 1, wherein said MgO epitaxial layer has a thickness of 6.2 nm or thicker.

11. A method for manufacturing the semiconductor device of claim 1 comprising the steps of:

(a) preparing an underlying layer having a single crystal surface;
    (b) epitaxially growing an MgO layer above said underlying layer to a thickness which enables, when a ZnO layer is grown thereon, to provide a +c polarity; and
    (c) growing on said MgO layer a layer consisting essentially of ZnO.

12. The method for manufacturing a semiconductor device according to claim 11, wherein said step (b) grows said MgO layer having rocksalt structure.

13. The method for manufacturing a semiconductor device according to claim 11, wherein said underlying layer is a non-polar single crystal substrate.

14. The method for manufacturing a semiconductor device according to claim 13, wherein said non-polar single crystal substrate is a sapphire substrate, an ScAlMgO$_4$ substrate or an Si substrate.

15. The method for manufacturing a semiconductor device according to claim 13 wherein said non-polar single crystal substrate is a c-plane sapphire substrate.

16. The method for manufacturing a semiconductor device according to claim 11, wherein said underlying layer is a −c polarity ZnO layer.

17. The method for manufacturing a semiconductor device according to claim 11, wherein said step (c) comprises the steps of:

(c-1) growing on said MgO layer a low temperature grown layer consisting essentially of ZnO, at a substrate temperature of 500° C. or lower;
    (c-2) annealing said low temperature growth layer at a temperature of 700° C. or higher; and
    (c-3) epitaxially growing on said annealed low temperature grown layer a high temperature grown layer consisting essentially of ZnO, at a substrate temperature of 600° C. or higher.

18. The manufacture method for a semiconductor device according to claim 11, wherein said step (b) is performed at a substrate temperature of 500° C. to 800° C.

19. The method for manufacturing a semiconductor device according to claim 11, wherein said steps (b) and (c) are performed by molecular beam epitaxy (MBE).

20. The method for manufacturing a semiconductor device according to claim 11, wherein said step (c) includes a step of growing a p-type layer doped with nitrogen.

21. A semiconductor device comprising:
    an underlying layer having a single crystal surface;
    an MgO epitaxial layer grown above said underlying layer and having a sufficient thickness, which enables, when a ZnO layer is grown thereon, to provide a substantially +c polarity, the thickness of said MgO epitaxial layer being 3.1 nm or greater; and
    an epitaxial layer grown on said MgO epitaxial layer, and consisting essentially of ZnO having a surface consisting essentially of a +c plane, said epitaxial layer including a p-type sublayer which is doped with N during the epitaxial growth at a concentration of $5\times10^{18}$ cm$^{-3}$ or higher, and said p-type sublayer having an x-ray diffraction peak of a (0002) plane with a full width at half maximum of 40-80 arcsec.

22. The semiconductor device according to claim 21, wherein said MgO epitaxial layer has a thickness of 4.1 nm or thicker.

23. The semiconductor device according to claim 22, wherein said MgO epitaxial layer has a thickness of 6.2 nm or thicker.

24. A semiconductor device comprising:
    an underlying layer having a single crystal surface;

an MgO epitaxial layer grown above said underlying layer, which enables, when a ZnO layer is grown thereon, to provide a substantially +c polarity, said MgO epitaxial layer having a thickness of 3.1 nm or thicker; and an epitaxial layer grown on said MgO epitaxial layer, having the +c polarity plane and consisting essentially of mixed crystal material of group II and VI elements, the group II element being Zn or a combination of Zn and at least one element selected from the group consisting of Mg, Cd, and Be, and the group VI element being O or a combination of O and at least one element selected from the group consisting of S, Se, and Te, said epitaxial layer including a p-type sublayer which is doped with N during the epitaxial growth at a concentration of $5 \times 10^{18} cm^{-3}$ or higher, and said p-type sublayer having an x-ray diffraction peak of a (0002) plane with a full width at half maximum of 40-80 arcsec.

25. The semiconductor device according to claim 24, wherein said MgO epitaxial layer has a thickness of 4.1 nm or thicker.

26. The semiconductor device according to claim 25, wherein said MgO epitaxial layer has a thickness of 6.2 nm or thicker.

* * * * *